(12) United States Patent
Min et al.

(10) Patent No.: US 7,501,191 B2
(45) Date of Patent: Mar. 10, 2009

(54) AMORPHOUS DIELECTRIC THIN FILM AND MANUFACTURING METHOD THEREOF

(75) Inventors: Yo-sep Min, Yongin-si (KR); Young-jin Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 215 days.

(21) Appl. No.: 10/953,267

(22) Filed: Sep. 30, 2004

(65) Prior Publication Data

US 2005/0191514 A1    Sep. 1, 2005

(30) Foreign Application Priority Data

Feb. 28, 2004    (KR)    ............ 10-2004-0013787

(51) Int. Cl.
*B32B 9/00* (2006.01)

(52) U.S. Cl. ............ 428/702; 501/134; 361/311; 428/630; 428/632; 438/240; 438/785

(58) Field of Classification Search ........ 428/702, 428/632, 630; 361/311; 501/134
See application file for complete search history.

(56) References Cited

U.S. PATENT DOCUMENTS

| | | | | |
|---|---|---|---|---|
| 3,609,482 A | * | 9/1971 | Edelman et al. ........ 361/320 |
| 4,306,214 A | * | 12/1981 | Miyabayashi et al. ...... 338/21 |
| 5,998,037 A | * | 12/1999 | Sridharan et al. ........ 428/472 |
| 6,255,122 B1 | * | 7/2001 | Duncombe et al. ........ 438/3 |
| 6,717,199 B2 | * | 4/2004 | Laibowitz et al. ........ 257/295 |
| 6,919,597 B2 | * | 7/2005 | Cho et al. ............ 257/310 |
| 2001/0014505 A1 | * | 8/2001 | Duncombe et al. ........ 438/286 |
| 2005/0272200 A1 | * | 12/2005 | Cho et al. ............ 438/240 |
| 2006/0180838 A1 | * | 8/2006 | Min et al. ............ 257/295 |

FOREIGN PATENT DOCUMENTS

EP    1391429 A1 *    2/2004

OTHER PUBLICATIONS

Wilk, G.D., et al. Entitled, J. Applied Physics, 87(1):484-492 (Jan. 1, 2000) "Hafnium and zirconium silicates for advanced gate dielectrics".
Chang, H.S., Entitled, Applied Physics Letters, 80(18):3385-3387, (May 6, 2002) "Excellent thermal stability of Al2O3/ZrO2/Al2O3 stack structure for metal-oxide-semiconductor gate dielectrics application".
Cho, M.-H., Entitled, Applied Physics Letters, 81(6):1071-1073 (Aug. 5, 2002) "Dielectric characteristics of Al2O3-HfO2 nanoaminates on Si(100)".

* cited by examiner

*Primary Examiner*—John J. Zimmerman
*Assistant Examiner*—Aaron Austin
(74) *Attorney, Agent, or Firm*—Lee & Morse, P.C.

(57) ABSTRACT

An amorphous dielectric film for use in a semiconductor device, such as a DRAM, and a method of manufacturing the amorphous dielectric film, includes bismuth (Bi), titanium (Ti), silicon (Si), and oxide (O). The amorphous dielectric film may have a dielectric constant of approximately 60 or higher. The amorphous dielectric film may be expressed by the chemical formula $Bi_{1-x-y}Ti_xSi_yO_z$, where $0.2 < x < 0.5$, $0 < y < 0.5$, and $1.5 < z < 2$.

29 Claims, 4 Drawing Sheets

AMORPHOUS DIELECTRIC THIN FILM AND MANUFACTURING METHOD THEREOF

BACKGROUND OF THE INVENTION

1. Field of the Invention

The present invention relates to an amorphous dielectric thin film for use in a capacitor of a highly integrated memory device and a manufacturing method thereof. More particularly, the present invention relates to an amorphous dielectric thin film that includes a bismuth (Bi)-titanium (Ti)-silicon (Si)-oxide (O) (BTSO)-based material having an amorphous microscopic structure as a capacitor of a memory device, and a manufacturing method thereof.

2. Description of the Related Art

As predicted by Moore's Law, the packing density of dynamic random access memory (DRAM), i.e., a highly integrated memory device, nearly quadruples every three years and design rules are continuously decreasing. Thus, a planar space occupied by a unit cell continuously decreases. In particular, in a case of a DRAM consisting of a single transistor and a single capacitor, the planar space of the capacitor is necessarily decreased, which in turn reduces the planar dimension of the capacitor, thereby lowering the capacitance C of the capacitor in accordance with equation 1 below:

$$C = \varepsilon \frac{A}{t} \quad (1)$$

where $\varepsilon$ denotes a dielectric constant, A denotes an effective area of the capacitor, and t denotes a thickness of the dielectric film.

Accordingly, although a feature size of a device continuously decreases, a capacitance (>25 fF/cell) required for the DRAM device operation should be maintained. Therefore, research continues into decreasing a thickness of a dielectric thin film and increasing an area of the dielectric film. Recently, considerable effort has been devoted to using a high dielectric oxide layer with a high dielectric constant (high-k) in place of a material such as $SiO_2$, which is used to form a conventional dielectric thin film.

In the semiconductor industry, a high dielectric thin film is employed in a gate oxide layer and a dielectric film of a DRAM capacitor. In the case of the gate oxide layer, current research is directed toward an oxide layer based on Hf or Zr and a group III metal oxide layer such as Lanthanide. Generally, because of a narrow energy band-gap, the high dielectric gate oxide layer suffers from a large leakage current and degraded thermo-stability at a high temperature during bonding to a silicon surface. Accordingly, attempts have been made to remedy these disadvantages of the dielectric films by adding $SiO_2$ or $Al_2O_3$ with excellent thermo-stability and a large energy band-gap.

However, a thin film formed by mixing a high dielectric material with $SiO_2$ or $Al_2O_3$ disadvantageously has an amorphous microscopic structure and a significantly lower dielectric constant. Resultantly, the use of such an amorphously structured mixture as a capacitor dielectric material is not attractive. For example, the dielectric constant of a (Ba,Sr)$TiO_3$ thin film (BST), which is known to be 250 or higher in a crystalline thin film with a perovskite structure, is decreased to approximately 25 when the thin film is changed to have an amorphous microscopic structure.

In order to be used as a capacitor dielectric material of a Gigabit-grade DRAM, a physical thickness $t_{phy}$ of a thin film should be less than 15 nm and an equivalent oxide layer thickness $t_{oxeq}$ should be roughly less than 1 nm. Therefore, such a conventional amorphous dielectric thin film could not be used. Accordingly, research on the capacitor dielectric film concentrated on a crystalline high dielectric thin film that has a problem of increased leakage current through a grain boundary once the thickness thereof becomes reduced to approximately 15 nm.

Further, the most serious problem occurring when applying a poly-atomic dielectric material such as BST is a difficulty in depositing a thin film with consistent composition in the case of a three-dimensionally structured pattern during the manufacture of a three-dimensional capacitor. This problem is caused by a small charge-to-radius ratio of a group II alkaline earth metals such as Ba and Sr, which results in an unstable precursor structure and insufficient vapor pressure.

SUMMARY OF THE INVENTION

The present invention is therefore directed to an amorphous dielectric thin film that includes a Bi—Ti—Si—O (BTSO)-based material having an amorphous microscopic structure as a capacitor of a memory device, and a manufacturing method thereof, which substantially overcome one or more of the problems due to the limitations and disadvantages of the related art.

It is a feature of an embodiment of the present invention to provide a BTSO-based amorphous thin film, and a manufacturing method thereof, for use as a dielectric film material of a capacitor of a device such as a DRAM that is able to prevent an increase of a leakage current caused when the physical thickness of a dielectric thin film is decreased.

It is another feature of an embodiment of the present invention to provide a BTSO-based amorphous thin film, and a manufacturing method thereof, for use as a dielectric film material of a capacitor of a device such as a DRAM that has a relatively large dielectric constant, e.g., 60 or higher.

It is still another feature of an embodiment of the present invention to provide a BTSO-based amorphous thin film, and a manufacturing method thereof, for use as a dielectric film material of a capacitor of a device such as a DRAM that has a substantially uniform thickness and composition during the manufacture of a capacitor having a three-dimensional structure.

At least one of the above and other features and advantages of the present invention may be realized by providing an amorphous dielectric film for use in a semiconductor device, the amorphous dielectric film including bismuth (Bi), titanium (Ti), silicon (Si), and oxide (O).

The amorphous dielectric film may have a dielectric constant of approximately 60 or higher.

In an embodiment of the present invention, the amorphous dielectric film may be the dielectric layer of a capacitor having a three-dimensional structure and the amorphous dielectric film may have a substantially uniform thickness and composition.

The Bi and Ti may have a similar ratio in the amorphous dielectric film.

The amorphous dielectric film may have a density in a range of approximately 6.5 to 7.1 $g/cm^3$. The amorphous dielectric film may have a current density of less than approximately $10^{-7}$ $A/cm^2$ at 1V. The amorphous dielectric film may have a dielectric breakdown strength of approximately 0.6 to 1.6 MV/cm.

At least one of the above and other features and advantages of the present invention may be realized by providing a method of manufacturing an amorphous dielectric film for use in a semiconductor device including a lower structure, a dielectric film, and an upper electrode, the method including forming the amorphous dielectric film including bismuth (Bi), titanium (Ti), silicon (Si), and oxide (O) on the lower structure.

In either embodiment, the amorphous dielectric film may be expressed by the chemical formula $Bi_{1-x-y}Ti_xSi_yO_z$ where $0.2<x<0.5$, $0<y<0.5$, and $1.5<z<2$ and the amorphous dielectric film may have a metal composition of 40% Bi, 40% Ti, and 20% Si.

The lower structure may be a $Ru/SiO_2/Si$ substrate.

Forming the amorphous dielectric film may include using atomic layer deposition.

Forming the amorphous dielectric film may include forming a single layer of Bi, Ti, and Si on the lower structure by a precursor using $O_3$ as a reaction gas. The precursor may be $Bi(mmp)_3$, $Ti(mmp)_4$, and $Si(OEt)_4$, where mmp represents 1-methoxy-2-methyl-2-propoxide and Et represents ethyl.

At least one of the above and other features and advantages of the present invention may be realized by providing a dynamic random access memory (DRAM), including a capacitor having a lower structure, an amorphous dielectric film formed on the lower structure, and an upper electrode formed on the amorphous dielectric film, wherein the amorphous dielectric film includes bismuth (Bi), titanium (Ti), silicon (Si), and oxide (O).

At least one of the above and other features and advantages of the present invention may be realized by providing a method of manufacturing a dynamic random access memory (DRAM) including providing a lower structure, forming an amorphous dielectric film including bismuth (Bi), titanium (Ti), silicon (Si), and oxide (O) on the lower structure, and forming an upper electrode on the amorphous dielectric film.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
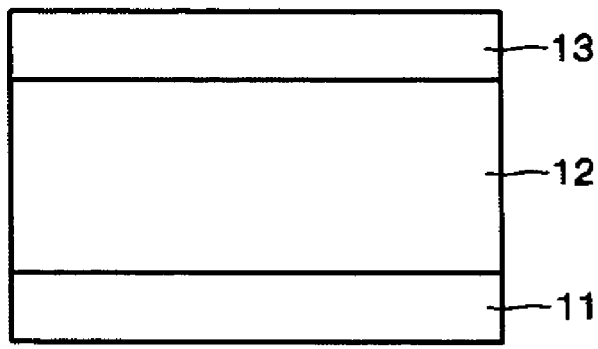
FIG. 1A illustrates a structure of a capacitor of a DRAM, which is a semiconductor memory device.

Korean Patent Application No. 2004-13787, filed on Feb. 28, 2004, in the Korean Intellectual Property Office, and entitled: "Amorphous Dielectric Thin Film and Manufacturing Method Thereof," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Like reference numerals and characters refer to like elements throughout.

Referring to FIG. 1A, a capacitor of a DRAM, which is a semiconductor memory device, includes a dielectric film 12 formed on a lower structure 11 and an upper electrode 13 formed on the dielectric film 12. According to an embodiment of the present invention, a Bi(bismuth)-Ti(titanium)-Si(silicon)-O(oxide) (BTSO)-based material is used as the dielectric film 12.

While composition ratios of the above materials are not defined, Bi and Ti may be formed in similar ratios. With regard to Si, the value of its dielectric constant tends to increase as a ratio of Si to the other materials decreases to approximately 50% or less. However, if the ratio of Si is excessively decreased, the amorphous dielectric film 12 becomes a crystalline film, and crystallization may cause a leakage current. The dielectric film 12 according to an embodiment of the present invention may be described by the following chemical formula $Bi_{1-x-y}Ti_xSi_yO_z$ (where $0.2<x<0.5$, $0<y<0.5$, and $1.5<z<2$).

A BTSO-based material having the above chemical composition is not a crystalline material, but rather, is an amorphous material, which does not permit leakage current through a grain boundary resulting from thin film formation. Moreover, the BTSO-based material has a high dielectric constant, e.g., approximately 60 or higher, which is achieved without performance of a separate annealing process for crystallization. Further, although the BTSO thin film that is an amorphous dielectric material is a poly-atomic oxide layer including three metal ions, it is favorable for a thin film process because the BTSO thin film has a small ion radius, good volatile property of a precursor relating to a large atomic value of three or greater, and good stability.

A method of manufacturing the BTSO thin film according to an embodiment of the present invention will now be described. Here, a $Ru/SiO_2/Si$ substrate is used as the lower structure 11, and an amorphous dielectric film according to an embodiment of the present invention is formed thereon. The amorphous dielectric film may be formed using atomic layer deposition. For the purpose of analyzing the characteristics of the dielectric film 12, three specimens of the dielectric film 12 are formed, having respective thicknesses of approximately 9.6 nm, approximately 12.9 nm, and approximately 14.2 nm, using atomic layer deposition. Each of the specimens has metal compositions of 40% Bi, 40% Ti, and 20% Si.

In order to form the dielectric film 12 according to an embodiment of the present invention, atomic layer deposition is performed at a low temperature. Forming the amorphous dielectric film may include forming a single layer of Bi, Ti, and Si on the lower structure by a precursor and using $O_3$ as a reaction gas. A precursor of Bi(mmp)$_3$, Ti(mmp)$_4$, and Si(OEt)$_4$, where mmp represents 1-methoxy-2-methyl-2-propoxide and Et represents ethyl, may be used for forming the thin film. The dielectric film 12 is formed in an amorphous state, which involves no annealing process for crystallization. A conventional technique for manufacturing a capacitor may be subsequently employed.

Figure 1B:
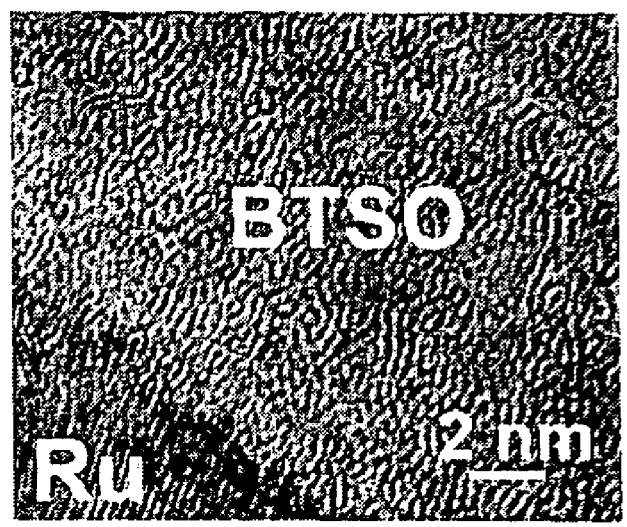
FIG. 1B is a transmission electron microscope (TEM) photograph showing a specimen of a BTSO-based dielectric film according to an embodiment of the present invention, wherein the specimen of the BTSO-based dielectric film is formed to a thickness of approximately 12.9 nm.

FIG. 1B is a TEM photograph of a specimen of the dielectric film 12 formed to a thickness of approximately 12.9 nm. Referring to FIG. 1B, the Ru layer of the lower structure 11 and the BTSO layer, which is the dielectric film 12 of the present invention, are shown. Here, the dielectric film 12 is in an amorphous state. A density of the dielectric film 12, which was formed according to an embodiment of the present invention is relatively high, i.e., in a range of approximately 6.5 to 7.1 g/cm$^3$, and was measured in an X-ray reflectivity (XRR) experiment.

In order to examine electrical characteristics of the dielectric film 12 manufactured as described above, leakage current, breakdown voltage, and dielectric constants are measured.

Figure 2A:
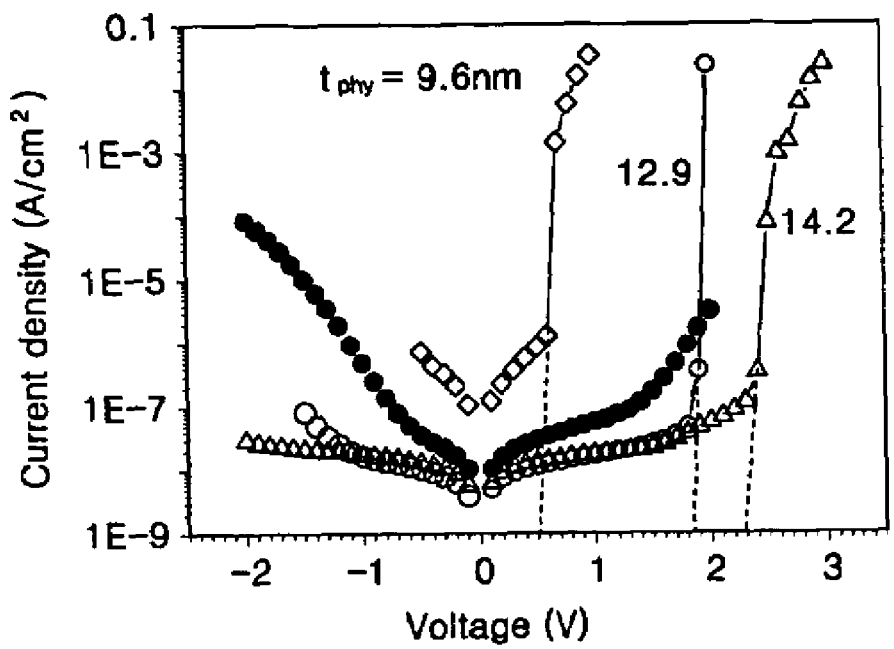
FIG. 2A is a graph of current density with respect to voltage for explaining leakage current characteristics of the BTSO-based dielectric film of FIG. 1B manufactured according to an embodiment of the present invention.

FIG. 2A is a graph of current density with respect to voltage for showing leakage current of the dielectric film 12. Referring to FIG. 2A, the current density is less than approximately $10^{-7}$ A/cm$^2$ at 1V, as required for a DRAM capacitor, thereby displaying excellent insulating characteristics. A dielectric breakdown strength of the dielectric layer 12, which is directly related to the reliability of the device, is approximately 0.6 to 1.6 MV/cm, thereby displaying superior insulating characteristics.

Figure 2B:
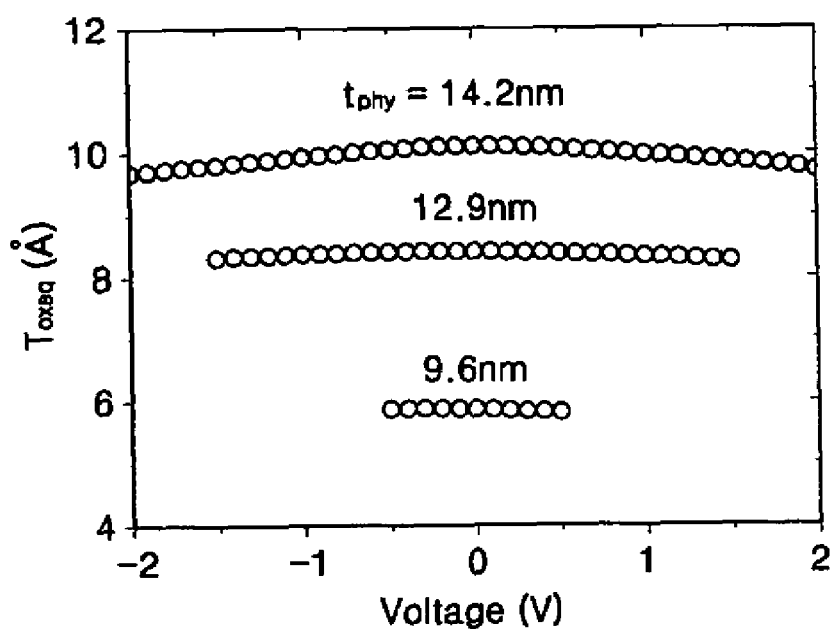
FIG. 2B is a graph of thickness of equivalent oxide layers with respect to voltage, for three (3) dielectric layers according to an embodiment of the present invention, the dielectric layers having a thickness of approximately 9.6 nm, approximately 12.9 nm, and approximately 14.2 nm, respectively.

FIG. 2B is a graph of thickness of equivalent oxide layers with respect to voltage for dielectric layers according to an embodiment of the present invention having a thickness of approximately 9.6 nm, approximately 12.9 nm, and approximately 14.2 nm. Referring to FIG. 2B, a specimen of the dielectric film 12 having a physical thickness of approximately 9.6 nm has an equivalent oxide layer thickness of approximately 5.9 Å. The other two specimens of the dielectric film 12, which have physical thicknesses of approximately 12.9 nm and approximately 14.2 nm, display equivalent oxide layers of approximately 8.3 Å and approximately 9.8 Å, respectively.

Figure 2C:
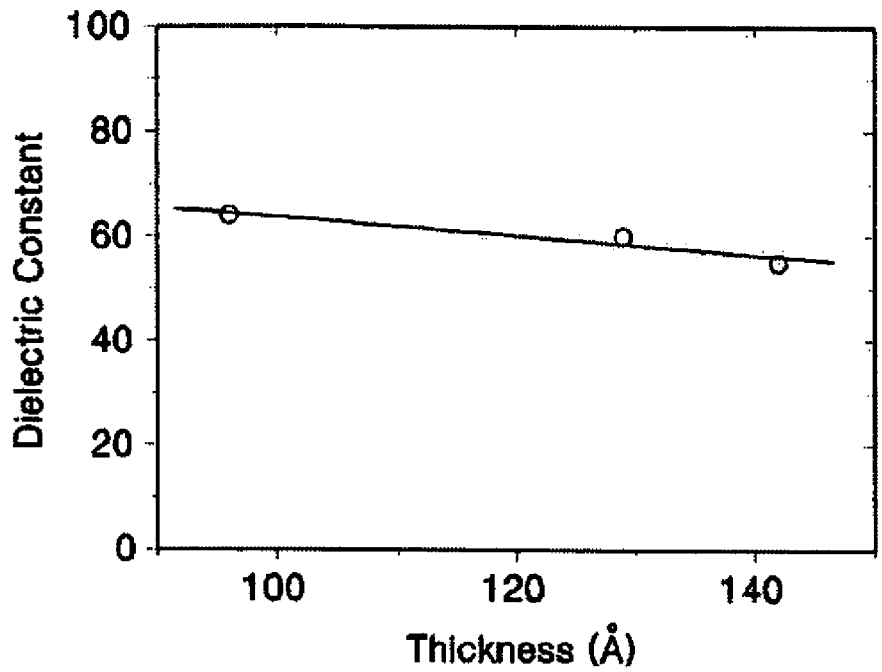
FIG. 2C is a graph of dielectric constant with respect to thickness of the equivalent oxide layers shown in FIG. 2B.

FIG. 2C is a graph of dielectric constant with respect to the thickness of the equivalent oxide layers shown in FIG. 2B. Referring to FIG. 2C, the dielectric film 12 having a thickness of approximately 9.6 nm has a dielectric constant of approximately 64. The other two specimens, which have thicknesses of approximately 12.9 nm and approximately 14.2 nm, respectively, also have relatively high dielectric constant values of approximately 55 or higher, which slightly differ according to thickness. The obtained value of the dielectric constant is significantly greater than the conventionally known value for an amorphous dielectric film. Specifically, considering that the conventionally known dielectric constant of an amorphous BST ((Ba,Sr)TiO$_3$) is approximately 25, the amorphous BTSO thin film according to an embodiment of the present invention has a dielectric constant that is more than two times larger.

Figure 3A:
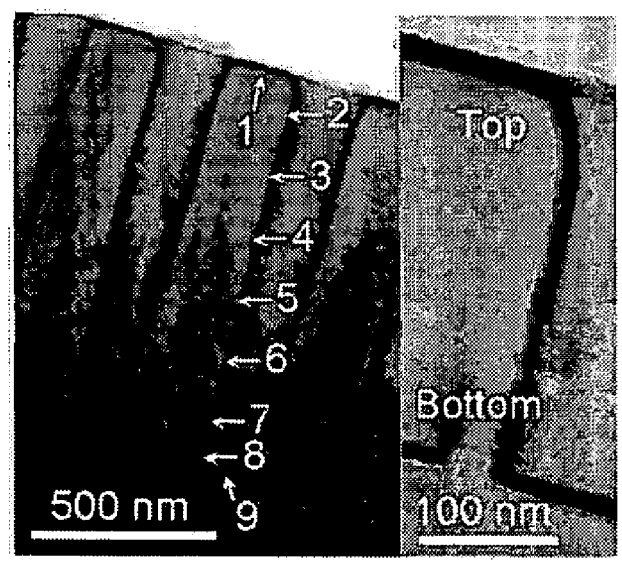
FIGS. 3A and 3B are a TEM photograph of a sectional view of a Bi—Ti—O-based thin film deposited in a hole pattern formed Of $SiO_2$ on a silicon substrate and having an aspect ratio of approximately 7 and a graph plotting atomic ratio of the Bi—Ti—O-based thin film shown in FIG. 3A with respect to position, respectively.
Figure 3B:
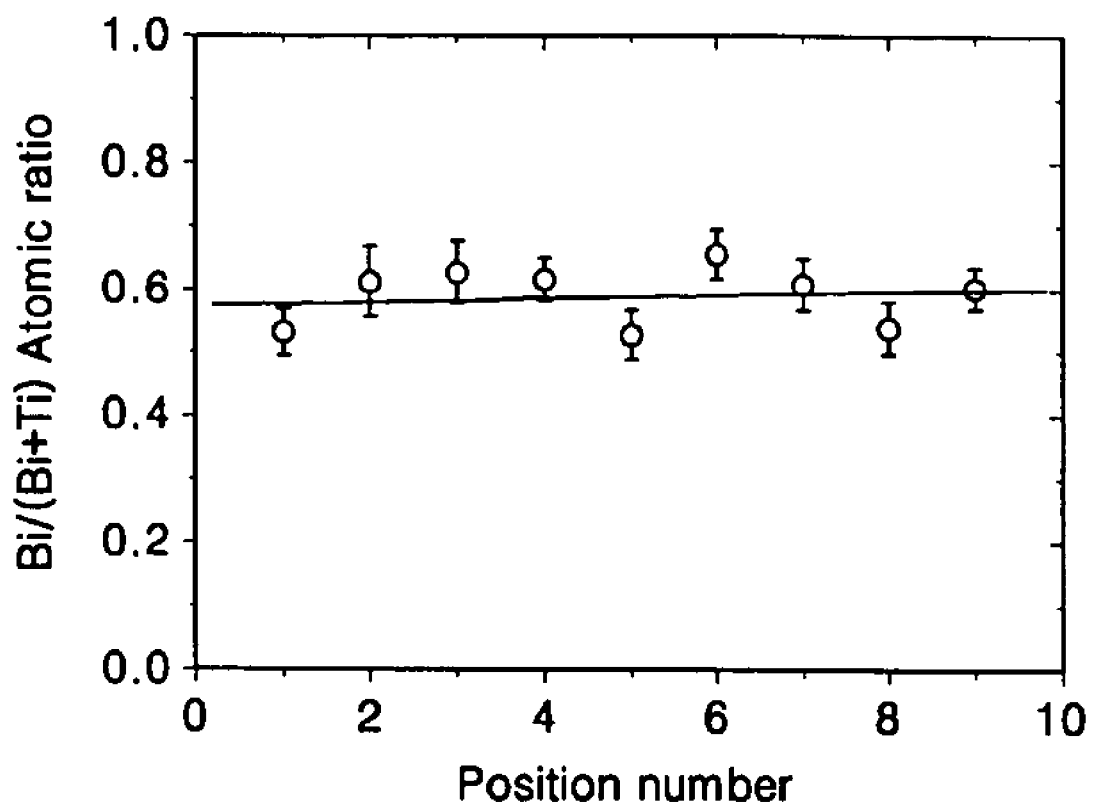

FIGS. 3A and 3B are a TEM photograph of a sectional view of a Bi—Ti—O-based thin film deposited in a hole pattern formed of SiO$_2$ on a silicon substrate with an aspect ratio of approximately 7 and a graph of atomic ratio with respect to position, respectively. FIGS. 3A and 3B illustrate the uniformity of the thickness and composition of the dielectric film 12, which were regarded as conventional problems when a poly-atomic dielectric film is applied to a complicated three-dimensional device. The experiment producing FIGS. 3A and 3B focused on a thin film with only a BiTi composition because it is difficult to obtain accurate data due to coating the thin film in the hole pattern formed of SiO$_2$ when Si is included in the composition analysis. The Si itself incurs no problem in processing since several processes are introduced to form the thin film thereon, but the composition consistency of Bi and Ti frequently causes a problem.

Referring to the TEM photograph of FIG. 3A, it can be seen that the thin film of Bi and Ti composition is evenly formed.

In order to confirm uniformity of the composition, the composition per position is analyzed by means of an energy diffusing x-ray system (EDS) at nine positions, viz., numbers 1 through 9 denoted on the TEM photograph of FIG. 3A. The measured results are then plotted on the graph shown in FIG. 3B. Referring to FIG. 3B, an atomic ratio of Bi/(Bi+Ti) is consistent at approximately 0.6. Resultantly, the Bi—Ti—Si—O-based thin film according to an embodiment of the present invention displays excellent step coverage as compared to other poly-atomic dielectric materials in view of its thickness and composition.

Using a BTSO-based amorphous thin film according to an embodiment of the present invention as a dielectric film material of a capacitor of a device such as a DRAM yields the following advantages. First, an increase in leakage current caused when the physical thickness of a dielectric thin film is decreased is prevented. Second, a large dielectric constant of 60 or higher is achieved despite using an amorphous thin film. Such a large dielectric constant is typically not achievable in the manufacture of a capacitor without performing an annealing process for crystallizing the amorphous thin film. Third, since elements that form the amorphous thin film have a relatively large charge-to-radius ratio, the thickness and composition consistency is substantially during the manufacture of a capacitor with a three-dimensional structure.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An amorphous dielectric film for use in a semiconductor device, the amorphous dielectric film comprising bismuth (Bi), titanium (Ti), silicon (Si), and oxide (O), wherein the amorphous dielectric film is expressed by the chemical formula $Bi_{1-x-y}Ti_xSi_yO_z$ and $0.2<x<0.5$, $0<y<0.5$, and $1.5<z<2$.

2. The amorphous dielectric film for use in a semiconductor device as claimed in claim 1, wherein the amorphous dielectric film has a dielectric constant of approximately 60 or higher.

3. The amorphous dielectric film for use in a semiconductor device as claimed in claim 1, wherein the amorphous dielectric film is the dielectric layer of a capacitor having a three-dimensional structure and the amorphous dielectric film has a substantially uniform thickness and composition.

4. The amorphous dielectric film for use in a semiconductor device as claimed in claim 1, wherein an atomic ratio of Bi to Ti, Si and O is similar to an atomic ratio of Ti to Bi, Si and O in the amorphous dielectric film.

5. The amorphous dielectric film for use in a semiconductor device as claimed in claim 4, wherein an atomic ratio of Bi to Ti is about 1:1 in the amorphous dielectric film.

6. The amorphous dielectric film for use in a semiconductor device as claimed in claim 1, wherein the composition of Bi, Ti and Si in the amorphous dielectric film has an atomic ratio of about 40 Bi:40 Ti:20 Si.

7. The amorphous dielectric film for use in a semiconductor device as claimed in claim 1, wherein the amorphous dielectric film has a density in a range of approximately 6.5 to 7.1 g/cm$_3$.

8. The amorphous dielectric film for use in a semiconductor device as claimed in claim 1, wherein the amorphous dielectric film has a current density of less than approximately $10^{-7}$ A/cm$^2$ at 1V.

9. The amorphous dielectric film for use in a semiconductor device as claimed in claim 1, wherein the amorphous dielectric film has a dielectric breakdown strength of approximately 0.6 to 1.6 MV/cm.

10. The amorphous dielectric film for use in a semiconductor device as claimed in claim 1, wherein an atomic ratio of Bi to Bi+Ti is about 0.6 in the amorphous dielectric film.

11. The amorphous dielectric film for use in a semiconductor device as claimed in claim 1, wherein the amorphous dielectric film consists essentially of Bi, Ti, Si and O.

12. A method of manufacturing an amorphous dielectric film for use in a semiconductor device including a lower structure, a dielectric film, and an upper electrode, the method comprising forming the amorphous dielectric film including bismuth (Bi), titanium (Ti), silicon (Si), and oxide (O) on the lower structure, wherein the amorphous dielectric film is expressed by the chemical formula $Bi_{1-x-y}Ti_xSi_yO_z$ and 0.2<x<0.5, 0<y<0.5, and 1.5<z<2.

13. The method of manufacturing an amorphous dielectric film as claimed in claim 12, wherein the lower structure is a Ru/SiO$_2$/Si substrate.

14. The method of manufacturing an amorphous dielectric film as claimed in claim 12, wherein the amorphous dielectric layer has a metal composition of 40% Bi, 40% Ti, and 20% Si.

15. The method of manufacturing the amorphous dielectric film as claimed in claim 12, wherein forming the amorphous dielectric film comprises using atomic layer deposition.

16. The method of manufacturing the amorphous dielectric film as claimed in claim 15, wherein forming the amorphous dielectric film comprises forming a single layer of Bi, Ti, and Si on the lower structure by a precursor and using O$_3$ as a reaction gas.

17. The method of manufacturing the amorphous dielectric film as claimed in claim 16, wherein the precursor is Bi(mmp)$_3$, Ti(mmp)$_4$, and Si(OEt)$_4$, where mmp represents 1-methoxy-2-methyl-2-propoxide and Et represents ethyl.

18. A dynamic random access memory (DRAM), comprising:
a capacitor having a lower structure, an amorphous dielectric film formed on the lower structure, and an upper electrode formed on the amorphous dielectric film, wherein:
the amorphous dielectric film includes bismuth (Bi), titanium (Ti), silicon (Si), and oxide (O), and
the amorphous dielectric film is expressed by the chemical formula $Bi_{1-x-y}Ti_xSi_yO_z$ and 0.2<x<0.5, 0<y<0.5, and 1.5<z<2.

19. The dynamic random access memory as claimed in claim 18, wherein the amorphous dielectric film has a dielectric constant of approximately 60 or higher.

20. The dynamic random access memory as claimed in claim 18, wherein the composition of Bi, Ti and Si in the amorphous dielectric film has an atomic ratio of about 40 Bi:40 Ti:20 Si.

21. The dynamic random access memory as claimed in claim 18, wherein the amorphous dielectric film has a density in a range of approximately 6.5 to 7.1 g/cm$^3$.

22. The dynamic random access memory as claimed in claim 18, wherein the amorphous dielectric film has a current density of less than approximately $10^{-7}$ A/cm$^2$ at 1V.

23. The dynamic random access memory as claimed in claim 18, wherein the amorphous dielectric film has a dielectric breakdown strength of approximately 0.6 to 1.6 MV/cm.

24. A method of manufacturing a dynamic random access memory (DRAM), comprising:
providing a lower structure;
forming an amorphous dielectric film including bismuth (Bi), titanium (Ti), silicon (Si), and oxide (O) on the lower structure, wherein the amorphous dielectric film is expressed by the chemical formula $Bi_{1-x-y}Ti_xSi_yO_z$ and 0.2<x<0.5, 0<y<0.5, and 1.5<z<2; and
forming an upper electrode on the amorphous dielectric film to form a capacitor having the lower structure, the amorphous dielectric film, and the upper electrode.

25. The method as claimed in claim 24, wherein the lower structure is a Ru/SiO$_2$/Si substrate.

26. The method as claimed in claim 24, wherein the amorphous dielectric layer has a metal composition of 40% Bi, 40% Ti, and 20% Si.

27. The method as claimed in claim 24, wherein forming the amorphous dielectric film comprises using atomic layer deposition.

28. The method as claimed in claim 27, wherein forming the amorphous dielectric film comprises forming a single layer of Bi, Ti, and Si on the lower structure by a precursor and using O$_3$ as a reaction gas.

29. The method as claimed in claim 28, wherein the precursor is Bi(mmp)$_3$, Ti(mmp)$_4$, and Si(OEt)$_4$, where mmp represents 1-methoxy-2-methyl-2-propoxide and Et represents ethyl.

* * * * *